US011946632B2

(12) United States Patent
Tobio et al.

(10) Patent No.: US 11,946,632 B2
(45) Date of Patent: Apr. 2, 2024

(54) CONTROL DEVICE INTERFACE, ESPECIALLY FOR VENDING MACHINES AND DISPLAYS

(71) Applicant: CAREL INDUSTRIES S.p.A., Brugine (IT)

(72) Inventors: Stefano Tobio, Brugine (IT); Paolo Marafin, Brugine (IT); Francesco Del Zoppo, Brugine (IT); Gianpaolo Zilio, Brugine (IT)

(*) Notice: Subject to any disclaimer, the term of this patent is extended or adjusted under 35 U.S.C. 154(b) by 100 days.

(21) Appl. No.: 17/756,746

(22) PCT Filed: Dec. 4, 2020

(86) PCT No.: PCT/IB2020/061502
§ 371 (c)(1),
(2) Date: Jun. 1, 2022

(87) PCT Pub. No.: WO2021/111389
PCT Pub. Date: Jun. 10, 2021

(65) Prior Publication Data
US 2023/0003362 A1  Jan. 5, 2023

(30) Foreign Application Priority Data
Dec. 6, 2019  (IT) .................. 102019000023187

(51) Int. Cl.
*F21V 3/00* (2015.01)
*F21V 9/08* (2018.01)
(Continued)

(52) U.S. Cl.
CPC .................. *F21V 3/00* (2013.01); *F21V 9/08* (2013.01); *G06F 3/041* (2013.01); *F21W 2111/00* (2013.01); *F21Y 2115/10* (2016.08)

(58) Field of Classification Search
None
See application file for complete search history.

(56) References Cited

U.S. PATENT DOCUMENTS

2018/0358966 A1* 12/2018 Cool .................... H03K 17/965
2019/0001629 A1   1/2019 Laluet

OTHER PUBLICATIONS

International Search Report & Written Opinion dated Mar. 10, 2021 from PCT Application No. PCT/IB2020/061502, 8 pages.

* cited by examiner

*Primary Examiner* — Christopher J Kohlman
(74) *Attorney, Agent, or Firm* — INNOVATION CAPITAL LAW GROUP, LLP; Vic Lin

(57) ABSTRACT

Described is an interface (10) for a control device having a front face (11) and a rear face (12) and comprising a plurality of layers grouped in a covering assembly (13) and a tactile assembly (14) extending between the front face (11) and the rear face (12); The covering assembly (13) comprises, in sequence: —a protective layer (15) having the front face (11); —a masking layer (16) which directly or indirectly covers a second face of the protective layer (15). The said tactile assembly (14) comprises—an operative layer (17) with sensitive pads (19) reactive to touch and permeable to light, transparent or perforated; —a matrix layer (21), opaque and equipped with shaped portions (23) which are either permeable to light or transparent or perforated and aligned with the sensitive pads (19). The sensitive pads (19) and/or the shaped portions (23) are configured to form signs (B) designed to generate luminous symbols visible after backlighting of the interface (10). The masking layer (16) has a permeability to light such that the signs (B) are not visible through said masking layer (16) when said front face (Continued)

(11) is illuminated by a light radiation resulting in a luminance not exceeding 4000 lx and the interface (10) is not backlit.

20 Claims, 2 Drawing Sheets

(51) Int. Cl.
*G06F 3/041* (2006.01)
*F21W 111/00* (2006.01)
*F21Y 115/10* (2016.01)

CONTROL DEVICE INTERFACE, ESPECIALLY FOR VENDING MACHINES AND DISPLAYS

This invention relates to a an interface for an electronic control device especially for refrigeration equipment such as vending machines, bottle coolers and refrigerated counters.

In particular, the interface according to the invention allows an improved appearance to be obtained compared to traditional interfaces, as well as allowing an integration of the interface to a decorative panel of a vending machine or display unit.

The interface according to the invention is especially designed for controllers of refrigerated vending machines or display units, that is, comprising an internal housing refrigerated by a refrigerating machine controlled by the controller.

A particularly advantageous embodiment of the interface according to the invention allows the interface to be made invisible from outside the vending machine or display unit when it is inactive.

Currently, prior art electronic control devices comprise a 7-segment display designed to form stylised numerical symbols or letters.

A 7-segment display consists of an integrated device which comprises a PCB on which are fixed LEDs covered by a screen equipped with seven segments, arranged in a figure of 8, which are translucent so that when each LED is switched on it corresponds to the illumination of a segment.

A touch sensitive interface is fixed above the 7-segment display.

This comprises an interface screen equipped with control symbols and a circuit, fixed underneath the screen and equipped with touch-sensitive components placed at the control symbols.

The interface screen is made up of two layers, one transparent outer layer and one finishing layer which is screen-printed on the inner face of the outer layer in such a way as to form a frame which surrounds the alpha-numeric screen of the 7-segment display and which presents the control symbols.

The customisations of this traditional device may concern the colour of the 7-segment display and/or the graphics of the interface screen.

In fact, special colours may be requested for the backlighting of the display of colours and/or graphics with colours or styles of the customised control symbols.

For this reason, in order to ensure the availability of such customisations it is necessary to procure 7-segment displays in different colours and it may be necessary to commission a multitude of screens with customised silkscreen printing from the interface screen supplier, to the detriment of the production economy particularly in the case of small batches.

In addition, traditional interfaces have the drawback that when the interface is switched off or inactive, the sectors of the 7-segment display and/or any control icons which would be backlit when in operation are still visible.

This aspect is considered to be detrimental to the appearance of the controller. The problem forming the basis of the invention is therefore to simplify the production of interfaces of electronic control devices.

The aim of the invention is therefore to provide a solution to this problem by making available an interface for an electronic control device which allows a simpler and more economical customisation compared to traditional interfaces. A further aim of the invention is to provide an interface for an electronic control device which will improve the appearance of the control device even when the interface is inactive.

Another aim of the invention is to provide an interface for a control device which is able to aesthetically integrate with the vending machine or display unit which integrates the control device, even when the interface is inactive.

This aim, as well as these and other aims which will emerge more fully below, are attained by an interface for a control device according to appended claim 1. Detailed features of an interface for a control device according to the invention are indicated in the dependent claims.

Further features and advantages of the invention will emerge more fully from the description of a preferred but not exclusive embodiment of an interface for a control device, illustrated by way of non-limiting example in the accompanying drawings, in which.

Figure 1:
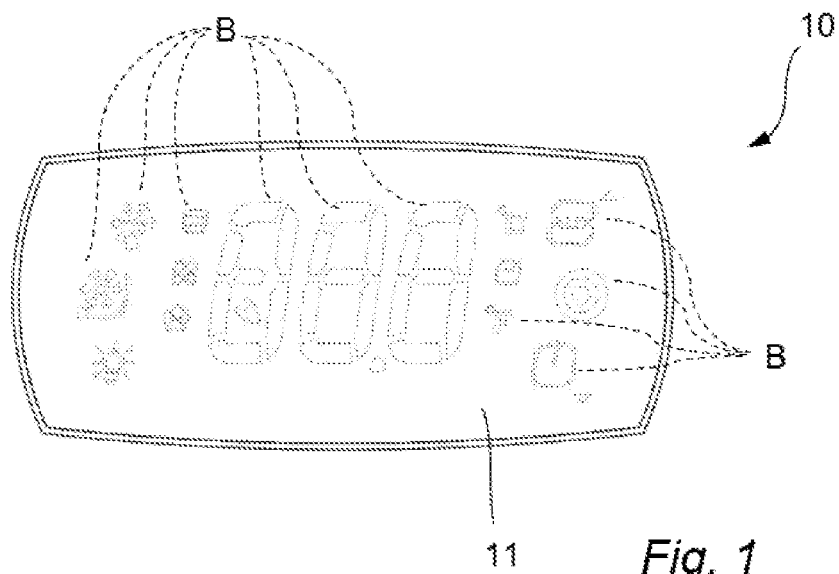
FIG. 1 illustrates a partially exploded partial perspective view of an interface for a control device according to the invention.
Figure 2:
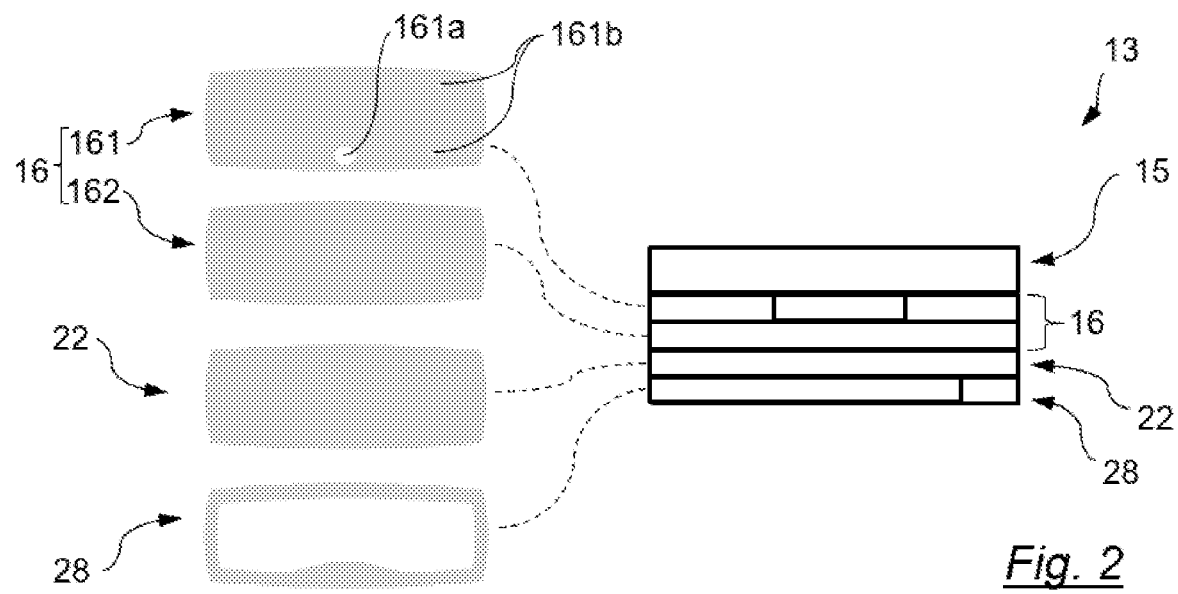
FIG. 2 illustrates a perspective view, from behind, of a component, relative to a composite screen, of an interface for a control device according to the invention.
Figure 3:
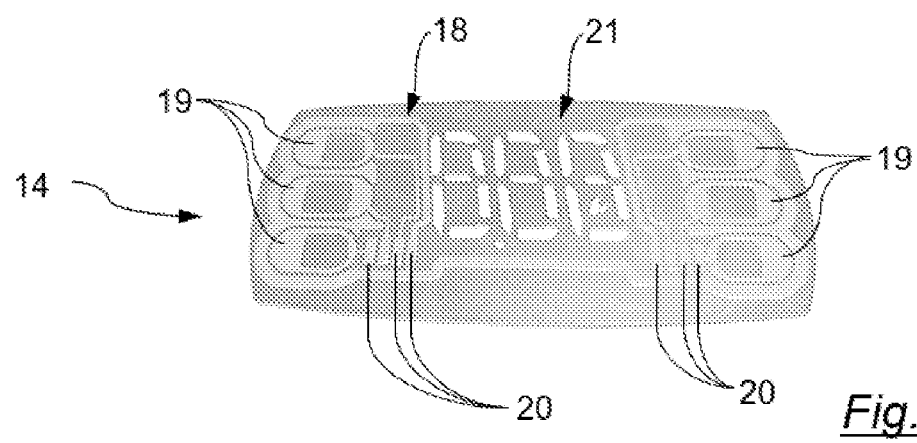
FIG. 3 illustrates a plan view of a simplified scheme of the detail of FIG. 2.

With particular reference to the above-mentioned drawings, the numeral 10 denotes in its entirety an interface 10 for a control device.

The interface 10 may develop mainly on a plane and comprise, in its thickness, that is, in a direction orthogonal to said plane, a plurality of layers.

The interface 10 can have a front face 11 and a rear face 12, the plurality of layers extending between the front face 11 and the rear face 12 through the thickness.

In particular, the plurality of layers comprises:

The layers of the plurality of layers are grouped together in a covering assembly 13 and a tactile assembly 14 which extend, in thickness, between the front face 11 and the rear face 12.

The covering assembly 13 and the tactile assembly 14 can form two unitary items which can be fixed to each other during the assembly of the interface 10, for example by means of an adhesive film, which can be equipped with a removable liner to expose it when the covering assembly 13 is joined to the tactile assembly 14.

As described in more detail below, the covering assembly 13 and the tactile assembly 14 may be formed by silkscreen or offset printing of one layer on the other, between the layers that make them up, possibly starting from a carrier layer which will be described in more detail below for each assembly.

The rear face 12 of the interface 10 can be attached to a lighting device, not illustrated, so that when the latter emits a light radiation it passes through the interface 10 from rear face 12 to front face 11.

In detail, the covering assembly 13 comprises, in sequence from front face 11, at least:

a protective layer 15 with a first face defining the front face 11; the protective layer 15 may constitute the above-mentioned carrier layer of the covering assembly;

a masking layer 16 which directly or indirectly covers a second face of the protective layer 15.

The masking layer 16 can then be applied, for example by silkscreen or offset printing, either directly on the protective layer 15 or an additional layer which is in turn applied to the protective layer 15 or to another layer applied to it.

The tactile assembly 14 comprises at least:
- an operative layer 17 which has electronic traces 18 defining an electrical circuit comprising sensitive pads 19, which are reactive to touch, and connection contacts 20 designed to connect the electronic circuit to connectors of an electronic controller with which interface 10 is designed to be assembled;
- a matrix layer 21 which is opaque and equipped with shaped portions 23 that are either permeable to light or transparent or perforated and are aligned with the sensitive pads 19, along the thickness of the interface 10.

Figure 4:
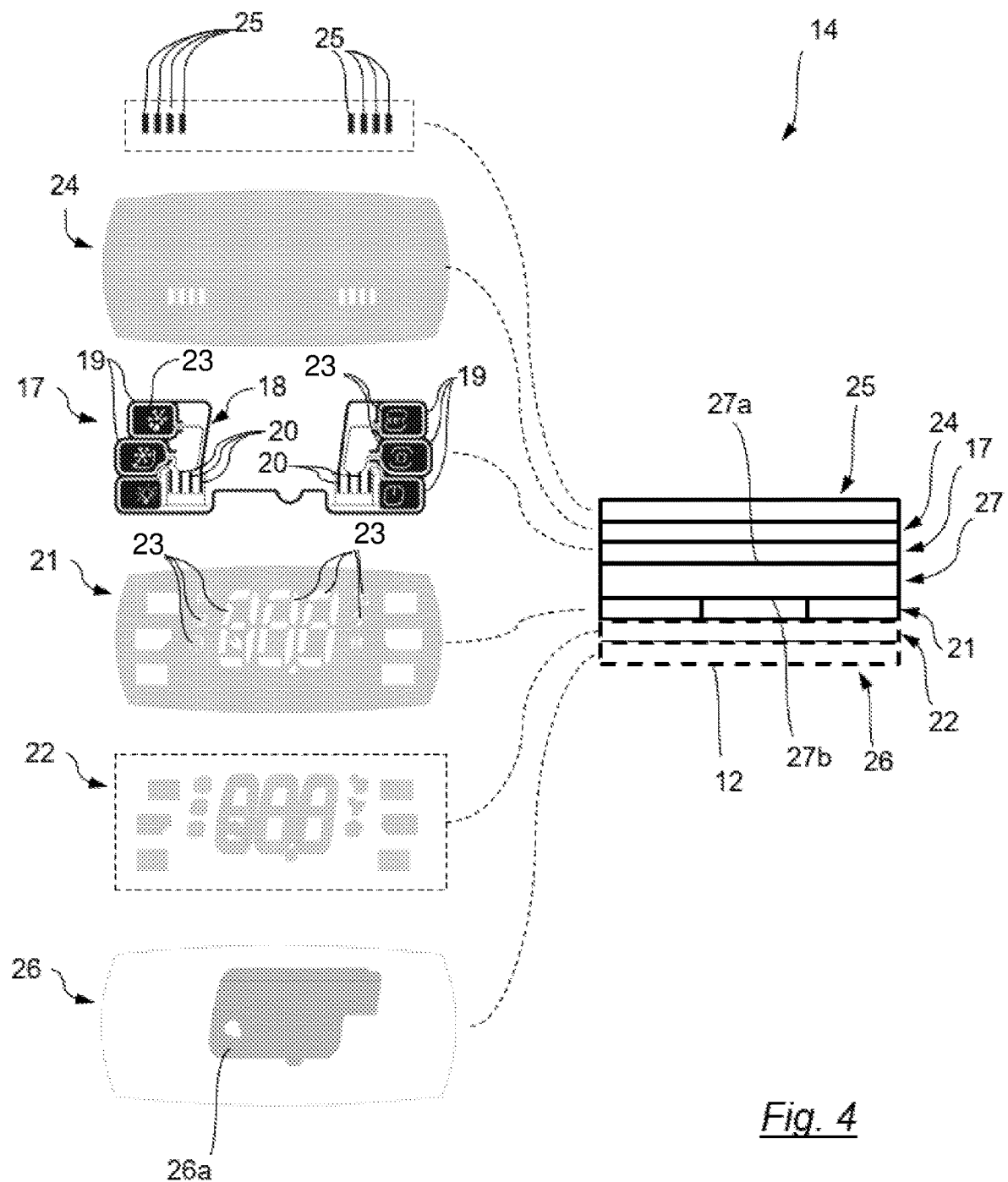
FIG. 4 illustrates a partial cross-section of an interface for a control device, according to the invention, through the plane IV-IV of FIG. 3.

Sensitive pads 19, as shown by a way of a non-limiting example in FIG. 4, and/or shaped portions 23 are configured to form signs B.

The shaped portions 23 can be made on the sensitive pads 19 and/or on the matrix layer 21, by way of a non-limiting example, in FIG. 4 the shaped portions 23 are made both on the sensitive pads 19 and on the matrix layer 21. The sensitive pads 19 are permeable to light, transparent or perforated in such a way as to provide, through them, luminous signs which can be seen by an operator facing the front face 11 of interface 10.

The protective layer 15 of the covering assembly 13 is configured to transmit a pressure generated by touch in such a way as to allow an actuation of the sensitive pads 19 through it.

At least one between the covering assembly 13 and the tactile assembly 14 comprises a diffuser layer 22, configured to homogenise a light radiation passing through it.

In particular, any diffuser layer 22 of the covering assembly 13 may extend for the entire shape, in plan, of the protective layer 16, in order to diffuse a backlighting radiation transversely to the thickness of interface 10, that is to say, in situ, it comes from the rear face 12 of interface 10 directed towards the front face 11.

The diffuser layer 22 of the covering assembly 13, if any, may completely or partially cover the masking layer 16, towards the rear face 12.

In particular, any diffuser layer 22 of the covering assembly 13 may be applied by silkscreen or offset printing on the masking layer 16 which may have been applied on the protective layer 15 for example by silkscreen or offset printing.

In general, the diffuser layer 22 may consist of a glossy ink with a gloss of between 70 Gloss Units and 90 Gloss Units, at 60° and may be made with the ink commercially known as Mara® Star SR produced by Marabu GmbH & Co. KG, as available on the date of filing of this application.

The masking layer 16 is placed, with respect to thickness, between the front face 11 and the matrix layer 21 and has a permeability to light such that the signs B are not visible through the masking layer 16 when the front face 11 is illuminated by a light radiation resulting in a luminance not exceeding 4000 lx and the interface 10 is not illuminated through the rear face 12.

The permeability to light of the masking layer 16 is such that said signs B are visible through the masking layer 16 when the interface 10 is illuminated through the rear face 12 by a light source with a light intensity not less than 45 mcd for example by LEDs emitting red light and powered at 5 mA and preferably with a light intensity of between 45 and 112.5 mcd, for example by LEDs emitting red light powered at 5 mA, or between 280 and 630 mcd for example by LEDs emitting white light powered at 5 mA.

In other words, the masking layer 16 has a permeability to light such that the signs B are invisible, for those looking at the front face 11 of the interface 10 under normal ambient lighting, if the interface 10 is not backlit, that is, illuminated through its rear face 12.

The masking layer 16 may comprise a layer of solvent-based ink, or consist of said ink.

Moreover, in general, the masking layer 16 can be made by deposition of said silkscreen or offset printing ink on an additional layer of the plurality of layers.

Said ink can be deposited on the protective layer 15, which can be made of polycarbonate and spread in plan throughout the entire shape of the interface 10.

In particular, the product known commercially as Mara® Panel MPA produced by Marabu GmbH & Co. can be used as the ink for making said masking layer 16. KG, as commercially available on the date of filing of this application. In order to electrically insulate the operative layer 17, the ink of the masking layer 16 can be electrically insulating and can have an electrical resistance of more than 1012 Ohm.

The masking layer 16 may comprise in sequence, towards the rear face 12:
- a chromatic masking layer 161 designed to comprise portions of different colours, for example aimed at forming a logo 161*a* or other commercial and/or functional symbols 161*b*, distributed in a matrix complementary to them with respect to the plan outline of the protective layer 15;
- a diffuser masking layer 162.

The diffuser masking layer 162 has the function of homogenising a light radiation in such a way that the signs B appear uniform when illuminated through the rear face 12 of the interface 10.

The protective layer 15 may comprise a transparent poly(methyl methacrylate) or polycarbonate layer, or may consist of it.

Moreover, the protective layer 15 has a transparency of not less than 80%, as defined in the test DIN EN ISO 13468-3, and preferably has a thickness of between 0.75 mm and 15 mm and preferably equal to 1 mm.

This gives the covering assembly 13 an adequate structural consistency which allows easy and safe handling when assembling the interface 10 and, at the same time, adequate transparency and reduced overall dimensions.

The tactile assembly 14 may also comprise a support layer 26 on which the additional layers included in tactile assembly 14 may be applied, either directly or indirectly.

The support layer 26 can comprise a polyester film, which can be stabilised for high temperatures, that is, for example, have a shrinkage of less than 0.2% at 170° C., and can have a thickness of between 0.1 mm and 0.125 mm.

In order to electrically insulate and at the same time protect the operative layer 17, the tactile assembly 14 can comprise an electrically insulating coating layer 24, which coats, towards the front face 11, the operative layer 17, except for the connection contacts 20.

The coating layer 24 may be made of dielectric material and may have a dielectric strength of at least 500 V-AC with a thickness of 30 µm, or at least 2400 V-AC with a thickness of 25 µm, determined according to ASTM D149-81 Method A.

The coating layer 24 may be made by silkscreen or offset printing of an ink on the operative layer 17, for example said ink may consist of the product commercially known as Electrodag® ML 25208 produced by Acheson Colloiden B.V. or the product D 150 EI produced by Chimet S.P.A, as commercially available at the date of filing of this application.

In order to guarantee electrical conduction and at the same time protection of the connection contacts 20, the tactile assembly 14 may comprise covering elements 25, comprising graphite that may be included in a matrix of polymeric material which may be a thermoplastic resin.

The covering elements 25 may cover the connection contacts 20 left uncovered by the coating layer 24 and may be complementary with the latter.

The covering elements 25 can be made by silkscreen or offset printing, on the operative layer 17, before or after the application of coating layer 24.

An ink which can be used to make the covering elements 25 may be the one commercially known as Electrodag® 965 SS produced by Acheson Colloiden B.V., as commercially available at the date of this application.

The matrix layer 21 can also be electrically insulating and can be made of dielectric material and have a dielectric strength of at least 2400 V-AC for a thickness of 25 μm, determined according to ASTM D149-81 Method A.

The electronic traces 18 of the operative layer 17 may consist of a conductive ink based on silver powder finely dispersed in a matrix which may be made of thermoplastic resin.

For example, this conductive ink based on silver powder can be selected from commercially known ones:
Electrodag® PF-410 manufactured by Acheson Industries (Europe) Ltd;
Ag515EI produced by Chimet SpA;
Electrodag® 725A-6S-54 manufactured by Acheson Colloids Company.

The interface 10 can also include a chromatic layer 27 designed to give a predefined colour to the light passing through it, directed towards the front face 11.

The chromatic layer 27 can be integrated into the tactile assembly 14 and can comprise a transparent and coloured shaped part 27a, configured to be aligned, in the direction of thickness of the interface 10, selectively to some of the signs B so as to give exclusively to them a predefined colour when they are backlit. The chromatic layer 27 can be made by silkscreen or offset printing for example on one side of the support layer 26, where, for example, the operating layer 17 is applied on the other side, or it can be applied on an additional layer, for example on the diffuser layer 22 of tactile assembly 14.

The possible diffuser layer 22 of the tactile assembly can be shaped in such a way as to consist of a plurality of parts shaped and aligned with the signs B, along the thickness of the interface 10, to homogenize the light directed to them from the rear face 12.

Sensitive pads 19 can be shaped in a closed or open loop in such a way that each one delimits an area, surrounding it at least partially, and are aligned with the signs B, with respect to the thickness of the interface 10, or surround them. The matrix layer 21 may consist of, except for in the shaped portions 23, an opaque ink with a light fastness of between 7 and 8 according to the blue wool scale defined by standard DIN16525.

The interface can also comprise a covering layer 28 which can be integrated into the covering assembly 13 and which can be shaped to form a frame extending along the perimeter of the outline in plan of the interface 10 and which has the function of hiding the presence of an adhesive for fixing the interface 10 to a lighting device.

The covering layer 28 can also consist of an opaque ink with a light fastness between 7 and 8 according to the blue wool scale defined by standard DIN16525.

The interface 10 may comprise a perimeter lip for ultrasonic welding to the lighting device, in which case the covering layer 28 is not necessary and need not be incorporated in the interface 10.

At least one of the operative layer 17, the coating layer 24, the covering elements 25, can be deposited by silkscreen or offset printing directly or indirectly on one of the faces of the support layer 26.

At least one between the diffuser layer 22 of the tactile assembly 14, the chromatic layer 27 and the matrix layer 21 can be deposited by silkscreen or offset printing directly or indirectly, rather than on said first face, on a second face of the protective layer 15, to avoid interactions between one or more of these layers with the operative layer 17, to preserve the technical functionality of the latter.

For example, the matrix layer 21 can be applied directly to the support layer 26

The invention as it is conceived is susceptible to numerous modifications and variants, all falling within the scope of protection of the appended claims.

Further, all the details can be replaced by other technically-equivalent elements. In practice, the materials used, as well as the contingent forms and dimensions, can be varied according to the contingent requirements and the state of the art. Where the constructional characteristics and the technical characteristics mentioned in the following claims are followed by signs or reference numbers, the signs or reference numbers have been used only with the aim of increasing the intelligibility of the claims themselves and, consequently, they do not constitute in any way a limitation to the interpretation of each element identified, purely by way of example, by the signs B or reference numerals.

The invention claimed is:

1. An interface (10) for control device having a front face (11) and a rear face (12) and comprising a plurality of layers grouped in a covering assembly (13) and a tactile assembly (14) extending between said front face (11) and said rear face (12); said rear face (12) being fixable to a lighting device so that when the latter emits a light radiation it crosses said interface (10), from said rear face (12) to said front face (11);
wherein said covering assembly (13) comprises, in sequence from said front face (11):
a protective layer (15) having a first face defining said front face (11);
a masking layer (16) directly or indirectly covering a second face of said protective layer (15);
wherein said tactile assembly (14) comprises:
an operative layer (17) having electronic traces (18) defining an electrical circuit comprising sensitive pads (19), which are touch-responsive, and connection contacts (20); said sensitive pads (19) being permeable to light, transparent or perforated;
a matrix layer (21), opaque and provided with shaped portions (23) which are permeable to light or transparent or perforated and are aligned with said sensitive pads (19), along said thickness;
wherein said sensitive pads (19) and/or said shaped portions (23) are configured to form signs (B) capable of generating visible luminous symbols following a backlighting of said interface 10;
wherein said protective layer (15) is configured to transmit a touch generated pressure so as to allow the actuation of said sensitive pads (19) through it;

wherein said covering assembly (13) and/or said tactile assembly (14) comprises:
a diffuser layer (22) configured to homogenise a light radiation passing through it;
wherein said masking layer (16) has a light permeability so that said signs (B) are not visible through said masking layer (16) when said front face (11) is illuminated by a light radiation which determines an illumination not more than 4000 lx and said interface (10) is not illuminated through said rear face (12); said light permeability being such that said signs (B) are visible through said masking layer (16) when said interface (10) is illuminated through said rear face (12) by a light source having a luminous intensity of not less than 45 mcd,
wherein said diffuser layer (22) consists of a glossy ink having a brilliance comprised between 70 Gloss Units and 90 Gloss Units, at 60°.

2. The interface (10) according to claim 1 wherein said masking layer (16) comprises, or consists of, a layer of solvent-based ink.

3. The interface (10) according to claim 2 wherein said ink is deposited by screen printing or offset printing on one of the further layers of said plurality of layers.

4. The interface (10) according to claim 3 wherein said ink is deposited on said protective layer (15), which can be of polycarbonate.

5. The interface (10) according to claim 3 wherein said ink is electrically insulating and can have an electrical resistance higher than $10^{12}$ Ohm.

6. The interface (10) according to claim 2 wherein said ink is electrically insulating and can have an electrical resistance higher than $10^{12}$ Ohm.

7. The interface (10) according to claim 2 where at least one of said masking layer (16), said diffuser layer and said matrix layer (21) are deposited by screen printing directly or indirectly on a second face of said protective layer (15).

8. The interface (10) according to claim 1 wherein said masking layer (16) comprises in sequence, towards said rear face (12):
a chromatic masking layer (16) suitable for comprising portions of different colours;
a diffuser masking layer (16).

9. The interface (10) according to claim 1 wherein said diffuser layer (22) covers said masking layer (16), towards said rear face (12).

10. The interface (10) according to claim 1 wherein said tactile assembly (14) comprises an electrically insulating coating layer (24) which covers, towards said front face (11), said operative layer (17) except for said connection contacts (20); said coating layer (24) which can be of dielectric material and can have a dielectric strength of at least 500 V-AC for a thickness of 30 μm, or at least 2400 V-AC for a thickness of 25 μm, determined according to the methodology ASTM D149-81 Method A.

11. The interface (10) according to claim 10 wherein said tactile assembly (14) comprises covering elements (25), comprising graphite optionally included in a matrix in polymeric material which can be a thermoplastic resin;
said covering elements (25) cover said connection contacts (20) left uncovered by said coating layer (24) and complementary with the latter.

12. The interface (10) according to claim 10 where at least one of said operative layer (17), said coating layer (24), said covering elements (25), said chromatic layer (27) and said matrix layer (21) are deposited by screen printing directly or indirectly on one of the faces of said support layer (26).

13. The interface (10) according claim 1 wherein said matrix layer (21) is electrically insulating it can be in dielectric material and can have a dielectric strength of at least 2400 V-AC for a thickness of 25 μm, determined according to the ASTM method D149-81 Method A.

14. The interface (10) according to claim 1 where the electronic traces (18) of said operative layer (17) consist of a conductive ink based on silver powder finely dispersed in a matrix that can be in thermoplastic resin.

15. The interface (10) according to claim 1 wherein said protective layer (15) comprises a layer of polymethylmethacrylate or polycarbonate, transparent, or consisting of it; said protective layer (15) has a transparency of not less than 80%, as defined in the DIN EN ISO 13468-3 test.

16. The interface (10) according to claim 1 comprising a chromatic layer (27) apt to give a light passing through it, directed towards said front face (11), a predefined colouring.

17. The interface (10) according to claim 1 wherein said sensitive pads (19) are shaped as closed or open ring so as each to delimit an area (D), surrounding it at least partially, which are aligned with said signs (B), with respect to said thickness.

18. The interface (10) according to claim 1 wherein said matrix layer (21) consists, except in said shaped portions (23), of an opaque ink having a lightfastness of between 7 and 8 according to the blue wool scale defined by DIN16525 standard.

19. The interface (10) according to claim 1 wherein said tactile assembly (14) comprises a support layer (26) onto which the further layers included in said tactile assembly (14) are applied, directly or indirectly; said support layer (26) comprising a polyester film, which can be stabilized for high temperatures (shrinkage %<0.2 at 170° C.) and can have a thickness between 0.1 mm and 0.125 mm.

20. The interface (10) according to claim 1 wherein said protective layer (15) comprises a layer of polymethylmethacrylate or polycarbonate, transparent, or consisting of it; said protective layer (15) has a transparency of not less than 80%, as defined in the DIN EN ISO 13468-3 test, and has a thickness between 0.75 mm and 15 mm.

* * * * *